(12) United States Patent
Sculley

(10) Patent No.: US 6,819,768 B1
(45) Date of Patent: *Nov. 16, 2004

(54) VOLUME CONTROL DEVICE USING A DIGITALLY ADJUSTABLE RESISTOR

(75) Inventor: Terry Sculley, Austin, TX (US)

(73) Assignee: ESS Technology, Inc., Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,621

(22) Filed: Sep. 24, 1998

(51) Int. Cl.[7] ............................................... H03G 3/00
(52) U.S. Cl. ......................... 381/104; 381/109; 330/284
(58) Field of Search ................................. 381/104, 102, 381/109, 94.5; 330/284, 144, 145; 341/153, 154

(56) References Cited

U.S. PATENT DOCUMENTS 5,523,721 A * 6/1996 Segawa et al. ............. 330/284

* cited by examiner

Primary Examiner—Ping Lee
(74) Attorney, Agent, or Firm—Gray Cary Ware & Freidenrich LLP; Peter R. Leal

(57) ABSTRACT

A volume control device including a digitally adjustable resistor. The digitally adjustable resistor causes a volume transition to be made in a series of incremental steps of small magnitude resulting in a smooth transition between volume levels, and, hence, no incidental noise.

5 Claims, 7 Drawing Sheets

VOLUME CONTROL DEVICE USING A DIGITALLY ADJUSTABLE RESISTOR

TECHNICAL FIELD

The invention relates to volume control, and more particularly to volume control regulated by a digitally adjustable resistor.

BACKGROUND INFORMATION

In an audio system playing an audible signal through a speaker, adjustments in volume typically may be made in an analog or a digital fashion. An analog volume control typically continuously changes the amplitude of the output signal, generally producing a smooth change in volume. A digital volume control typically changes volume in a series of one or more discrete steps, which may cause a step change in the output going to the speaker. This step change may produce an artifact that sounds like a "pop" or "click" to the listener, with the level of the pop typically depending on the height of the step change of the output. A large step change typically causes a larger pop than a small step change. Pops that are easily audible are undesirable, and manufacturers of audio equipment often strive to minimize or eliminate these artifacts.

Moreover, recent audio standards have required the ability to adjust volumes over a very large range, e.g., 90 db. This means that the volume control may need to change volume levels over a very wide range. means that the volume control may need to change volume levels over a very wide range.

SUMMARY

The device described herein provides volume transitions and with minimal incidental noise.

The invention provides a volume control device including a digitally adjustable resistor that can be selectively connected across any of a number of volume controlling resistors. The digitally adjustable resistor can be adjusted to allow a volume transition in a series of incremental steps of small magnitude. This incremental transition results in a smooth transition between volume levels, and minimizes incidental noise.

DESCRIPTION OF DRAWINGS

Like reference numbers and designations in the various Drawings indicate like elements.

DETAILED DESCRIPTION

The structure and operational parameters of preferred embodiments of the invention will be explained below making reference to the Drawings.

Figure 1:
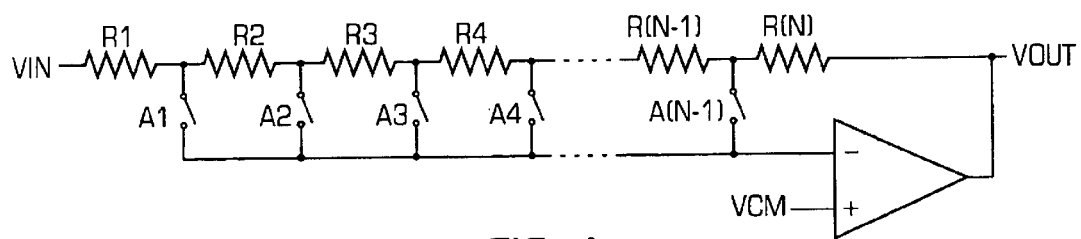
FIG. 1 shows a diagram of a volume control device which is a conventional volume control stage.

FIG. 1 shows a conventional volume control stage. A voltage input $V_{IN}$ is connected to a voltage output $V_{OUT}$ through a series of N resistors R1 to R(N) and setting switches A1 to A(N−1) forming a ladder. Setting switches A1 to A(N−1) are opened and closed to change the resistance of the ladder which in turn determines a gain for the volume control stage. Only one setting switch is closed at any given time. Upon closing a setting switch, a connection is made to an inverting input 100 of an operational amplifier 102. A noninverting input 104 of the operational amplifier 102 is connected to a voltage source VCM. Each combination of one closed setting switch and other setting switches open represents a main setting for a level of gain. Each main setting corresponds to a volume level controlled by the volume control stage. Thus to change from one volume level to a second volume level, the volume control stage changes from one corresponding main setting to a second corresponding main setting. The volume control stage changes from one main setting to a second main setting by opening a closed setting switch and simultaneously closing an appropriate open setting switch. This process is well known.

As described above, when the magnitude of difference in gain between main settings is large (e.g., greater than 1 mv), the switching from one main setting to another may create incidental noise ("pops" and "clicks"). In order to increase the number of settings, and thus reduce the magnitude of the change in gain between settings and reduce incidental noise, the number of resistors and setting switches might be increased. However, simply increasing the number of resistors and setting switches becomes impractical as the number of settings increases.

The present invention obviates this tradeoff by using a digitally adjustable resistor. The digitally adjustable resistor allows a gradual change in resistance when changing from one main setting to another. This gradual change in resistance produces a gradual change in gain and so avoids the undesirable incidental noise. By using a digitally adjustable resistor as described below the need for an impractically large number of resistors to effect the gradual transition is also avoided.

Conceptually, a difference in magnitude of gain between a first main setting and a second main setting is divided into N sections, and hence N intermediate settings. These intermediate settings allow a more gradual transition between main settings. By decreasing the magnitude of each transition and increasing the time between transitions, a "slow ramp" effect is achieved.

Figure 2A:
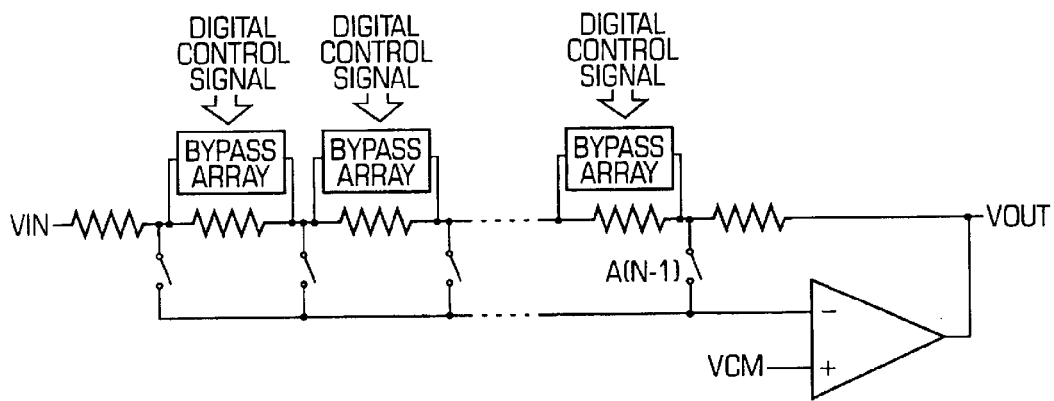
FIG. 2A shows a diagram of a volume control device including a bypass array.
Figure 2B:
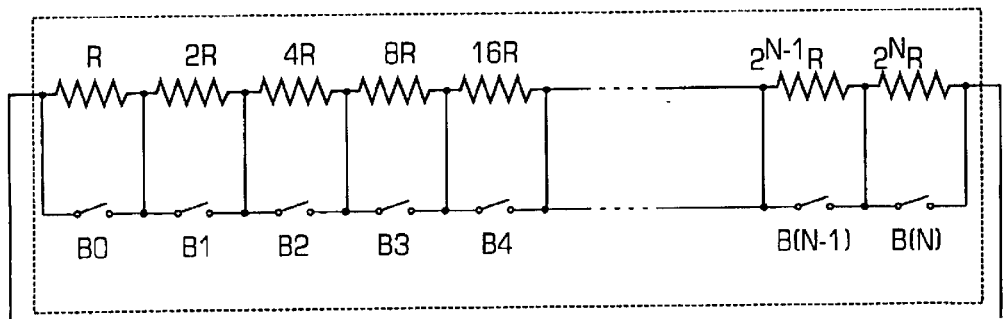
FIG. 2B shows a diagram of switches and resistors making up a bypass array.

In order to create this "slow ramp" through intermediate settings, a second set of bypass switches and bypass resistors may be used. This second set can be used to form a bypass array connected as shown in FIG. 2A. FIG. 2B shows a detailed view of the circuit which forms the bypass array in FIG. 2A. In one configuration, these bypass switches and bypass resistors form a binary series array. For N intermediate settings there are X bypass switches and X bypass resistors, where X is equal to the number of digits in the binary value of N (e.g., if N is 5 (101), X is 3; if N is 46 (101110), X is 6). The bypass resistors have resistances which vary from a resistance R to $2^{X-1}R$ in a binary series (i.e., R, 2R, 4R, 8R, ..., $2^{X-2}R$, $2_{X-1}R$). Various combinations of the bypass switches are used in response to digital controls. This configuration allows the total resistance of the bypass array to vary between zero (all bypass switches closed) and a maximum determined by the bypass resistors used (all bypass switches open).

As a simplified example, a volume stage as shown in FIG. 1 is set to a first main setting where setting switch A1 is closed and the remaining setting switches A2 to A(N−1) are open. To set the volume stage to the second main setting, setting switch A1 must be opened and setting switch A2 must be closed. To avoid the incidental noise resulting from a sudden large change in gain, a bypass array is used. As shown in FIG. 2A, the bypass array is connected around a resistor defining the second main setting (R2 in FIG. 1). To effect the gradual transition, through binary combinations of the bypass switches and bypass resistors, all the bypass switches B0 to B(N) are closed, gradually reducing the resistance of the bypass array to a minimum. This low resistance in the bypass array creates a similar effect to that if resistor R2 were shorted. Setting switch A1 is opened and simultaneously open setting switch A2 is closed. Because resistor R2 is shorted by the bypass array, the gain will not change from opening setting switch A1 and closing setting switch A2. Through binary combinations of the bypass switches and bypass resistors, gradually the resistance of the bypass array is increased up to the maximum, creating a similar effect to that if the bypass array were disconnected. This bypass array example illustrates the operation of the "slow ramp" process.

In the preferred embodiment of the present invention, instead of a bypass array as described above, a digitally adjustable resistor ("DAR") is used. In response to digital control signals, the resistance of the DAR varies between very low (preferably close to zero, approximating a wire) and very high (preferably approximating an open switch). The use and operation of digitally adjustable resistors is described in the article "Digitally Adjustable Resistors in CMOS for High-Performance Applications" by Thaddeus J. Gabara and Scott C. Knauer, published in *IEEE Journal of Solid-State Circuits*, vol. 27, which is herein incorporated by reference.

Figure 3:
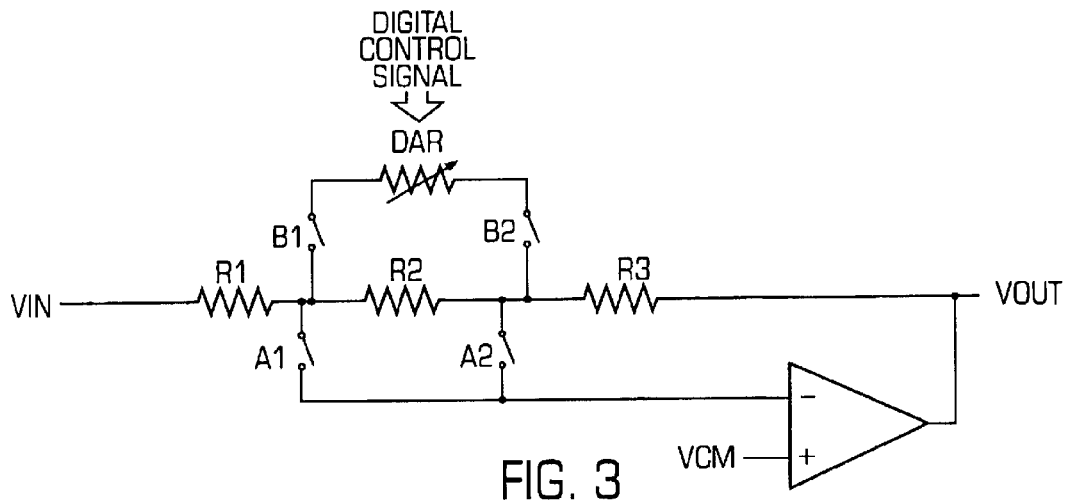
FIG. 3 shows a diagram of a volume control device including a digitally adjustable resistor according to an embodiment of the present invention.

FIG. 3 shows a volume control device including a DAR. In this simplified example, there are only two main settings, indicated by two pairs of setting switches and resistors A1–R1 and A2–R2. As described above, when the volume control is set to the first main setting a setting switch A1 is closed and a setting switch A2 is open. The second main setting is realized when setting switch A1 is open and setting switch A2 is closed. The transition from one main setting to another main setting uses the DAR. The DAR is connected as shown in FIG. 3 with a digital control signal input. When the volume control device is not in transition, transition switches B1 and B2 to the DAR are open. When the transition begins, transition switches B1 and B2 are closed. Once the transition ends, transition switches B1 and B2 are opened again.

Effectively using the DAR in transitions preferably involves three general steps: (1) connecting the DAR without significantly changing the gain; (2) gradually changing the gain of the volume control from the present level to a target level; and (3) disconnecting the DAR without significantly changing the gain. These steps are achieved by using digital control signals to gradually change the resistance of the DAR in coordination with opening and closing switches of the volume control.

Figure 4A:
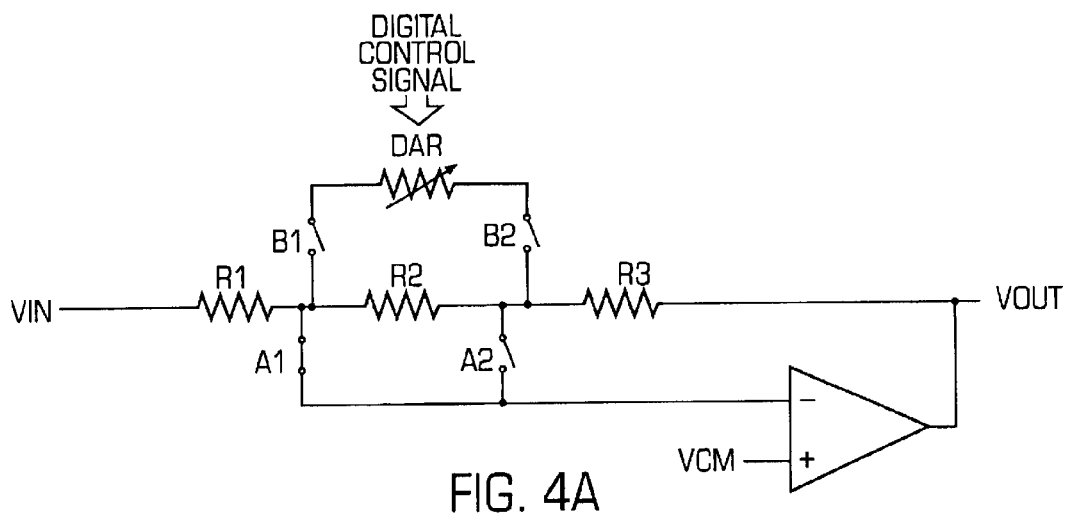
FIGS. 4A to 4D show a series of steps to change a volume control device from one setting to another.
Figure 4B:
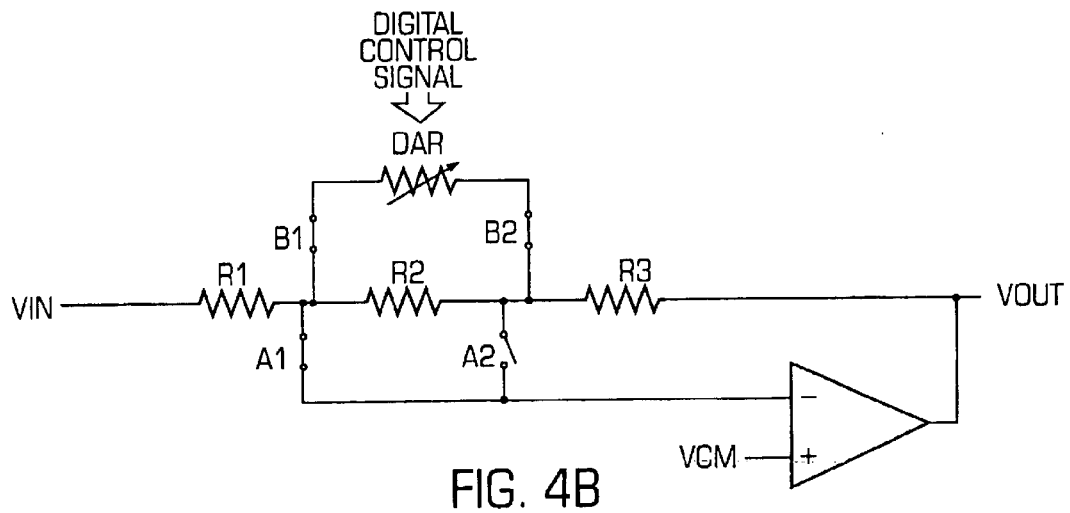

FIGS. 4A to 4D illustrate an example of a process for changing from the first main setting to the second main setting. Initially, in FIG. 4A, setting switch A1 is closed and setting switch A2 is open. Transition switches B1 and B2 to the DAR are open. To connect the DAR without significantly changing the gain of the volume control, the DAR is set to a desired high resistance. Then transition switches B1 and B2 to the DAR are closed, putting the DAR in parallel with resistor R2 (FIG. 4B). Because the DAR resistance is very high, the gain will not change significantly.

Figure 4C:
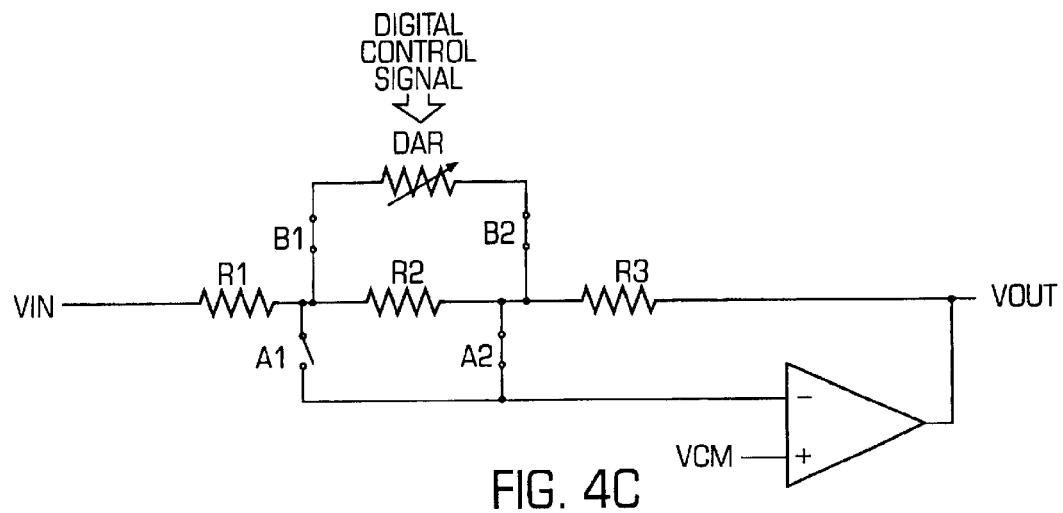

To gradually change the gain of the volume control from that of the first main setting to that of the second main setting, the digital control signals are then changed to gradually reduce the DAR resistance. The incremental change of the DAR resistance is small to provide a slow change in the gain of the device. When the DAR reaches a desired low resistance, setting switch A1 is opened and setting switch A2 is closed (FIG. 4C). Because the DAR resistance is very low, resistor R2 is effectively shorted so the gain of the device will not change significantly.

Figure 4D:
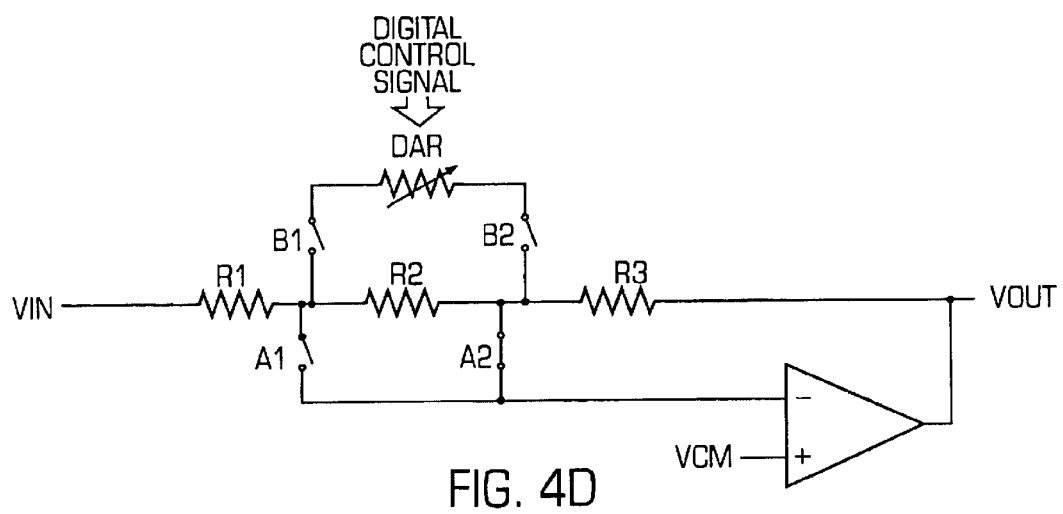

To disconnect the DAR without significantly changing the gain, the digital control signals are changed to gradually raise the DAR resistance. When the DAR reaches a desired high resistance, transition switches B1 and B2 to the DAR are opened, disconnecting the DAR (FIG. 4D). The DAR resistance is very high creating a similar effect to that when the DAR is disconnected. Thus, the gain of the device will not change significantly from disconnecting the DAR. At this point, the volume control is set to the second main setting: setting switch A1 is open; setting switch A2 is closed; and the transition switches are open so the DAR is disconnected.

To change from the second main setting to the first main setting, the same process is used, but the steps are reversed in sequence. Initially, setting switch A1 is open and setting switch A2 is closed. The DAR is set to a desired high resistance. Then transition switches B1 and B2 are closed. As described above, because the resistance of the DAR is very high, the gain will not change significantly. The digital control signals are changed to gradually reduce the DAR resistance. Each resistance change increment is preferably sufficiently small to prevent undesirable noise such as pops and clicks. When the DAR reaches a desired low resistance, setting switch A1 is closed and simultaneously setting switch A2 is opened. Because the resistance of the DAR is very low, the gain will not change significantly. The digital control signals are changed again to gradually raise the DAR resistance. When the DAR reaches a desired high resistance, transition switches B1 and B2 are opened, disconnecting the DAR. Because the DAR resistance is very high, the gain will not change significantly. At this point, the volume control is set to the first main setting: setting switch A1 is closed; setting switch A2 is open; and the transition switches are open so the DAR is disconnected.

Figure 5:
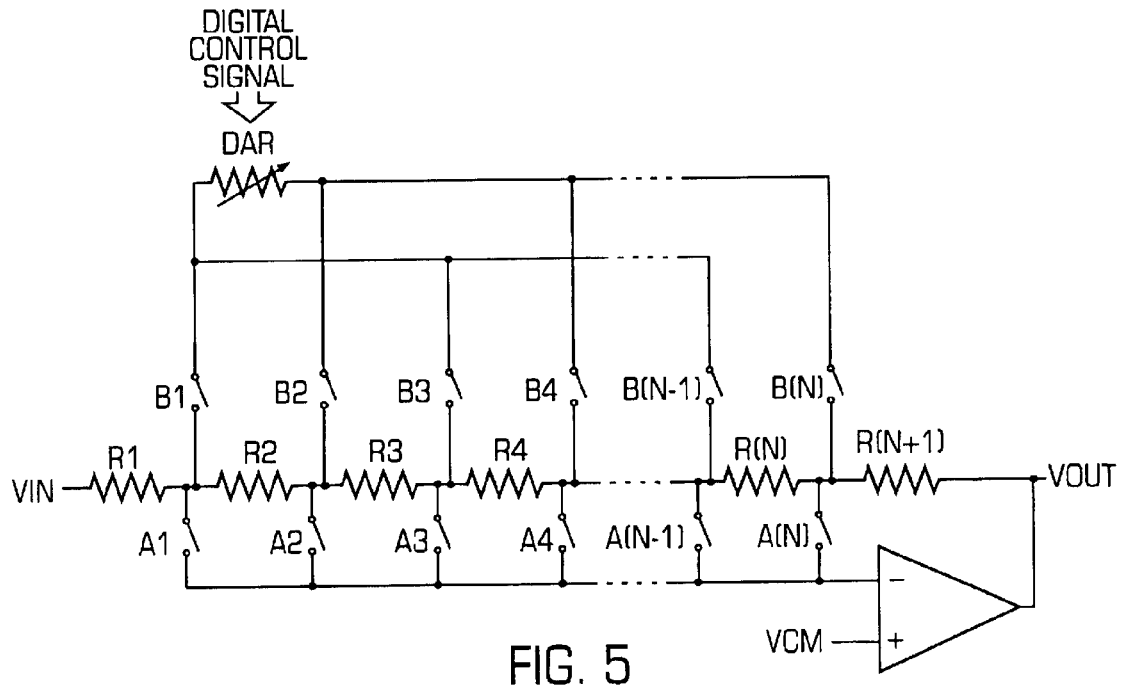
FIG. 5 shows a diagram of a volume device including a digitally adjustable resistor according to another embodiment of the present invention

FIG. 5 illustrates a DAR connected to a volume control device with multiple main settings. A single DAR can be used for all the transitions between main settings. In order to accomplish this, the DAR is connected by transition switches to a resistor string. As in FIG. 3, the first end of the DAR is connected by a transition switch B1 to a node between resistors R1 and R2, while the second end of the DAR is connected by a transition switch B2 to a node between resistors R2 and R3. In order to use the DAR for a transition between a second main setting and a third main setting, the first end of the DAR is connected by a transition switch B3 to a node between resistors R3 and R4. Similarly, there are switches connecting nodes between the remaining resistors to alternating ends of the DAR (i.e., transition switch B4 connects to the second end of the DAR, transition switch B5 connects to the first end, and so on). In this way a pair of transition switches connected to the DAR which surround a resistor are used to effect a gradual transition across that resistor.

Figure 6A:
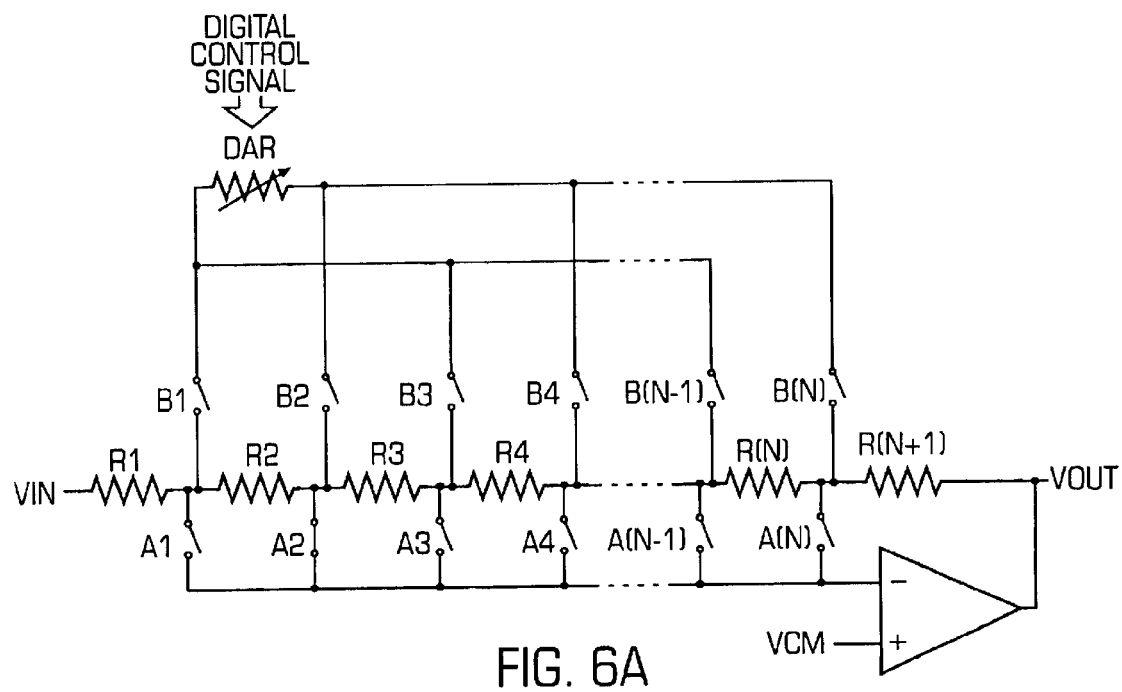
FIGS. 6A to 6F show a series of steps to change a volume control device from one setting to another.
Figure 6B:
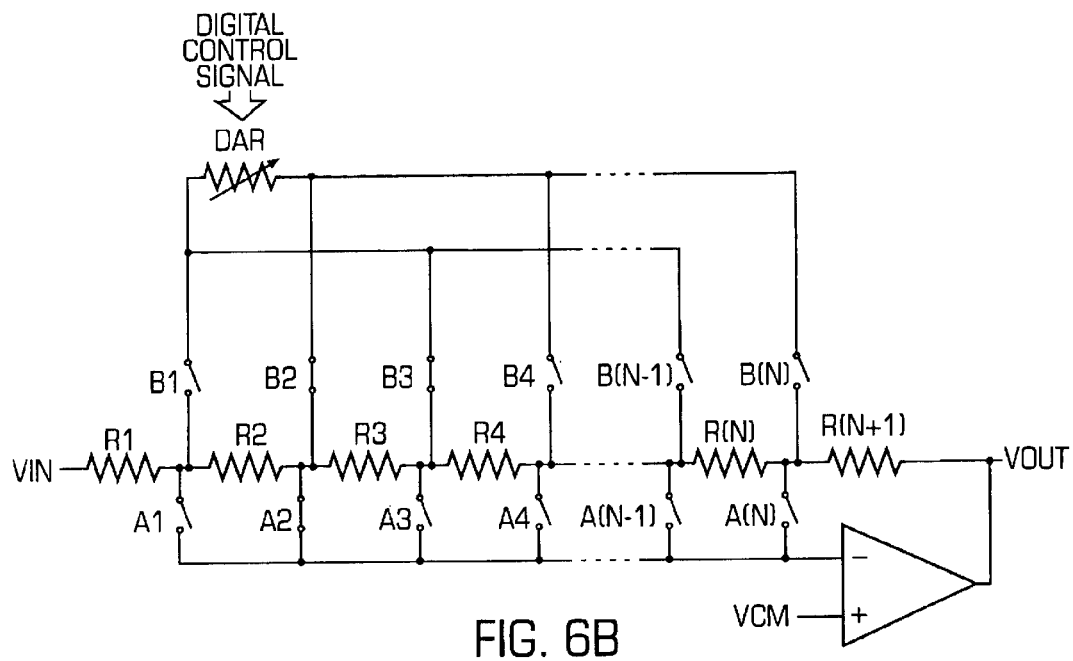

For example, FIGS. 6A to 6F illustrate a preferred process of switching from a second main setting to a fourth main setting (similar to the process described above and shown in FIGS. 4A to 4D for switching from a first main setting to a second main setting). Initially, as in FIG. 6A, the device is set to the second main setting, with only one setting switch A2 is closed, while the remaining setting switches A1, A3 to A(N), and transition switches B1 to B(N) are open. Then the following steps are performed:

(1) The DAR is set to a desired high resistance and transition switches B2 and B3 are closed (FIG. 6B).

(2) The DAR transitions to a desired low resistance.

Figure 6C:
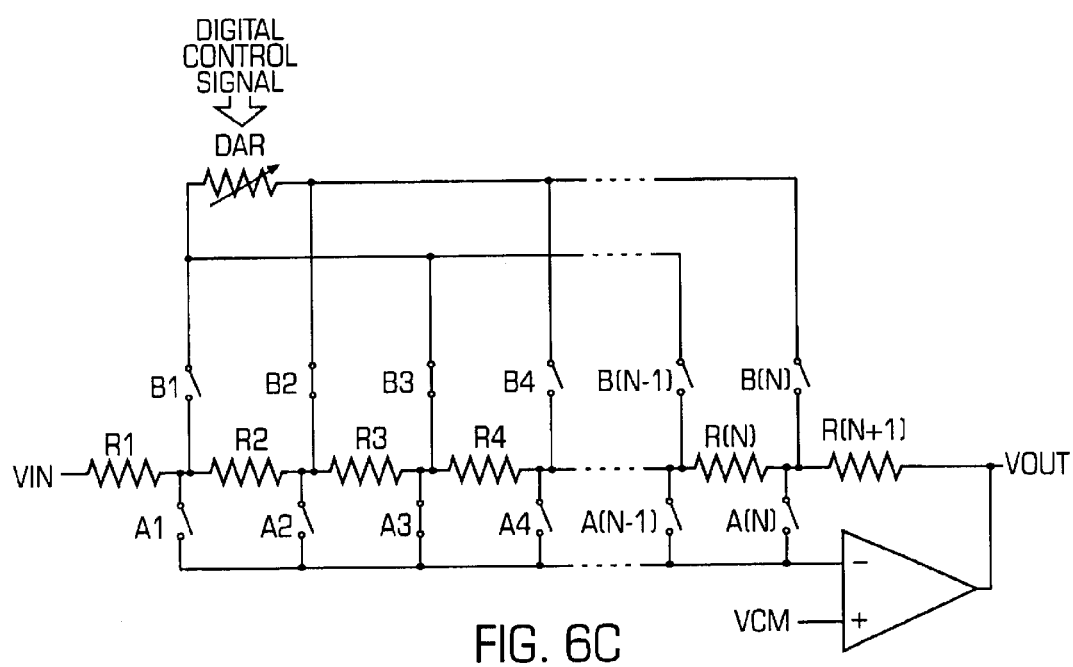

(3) Setting switch A2 is opened and setting switch A3 is closed (FIG. 6C).

(4) The DAR transitions to a desired high resistance.

Figure 6D:
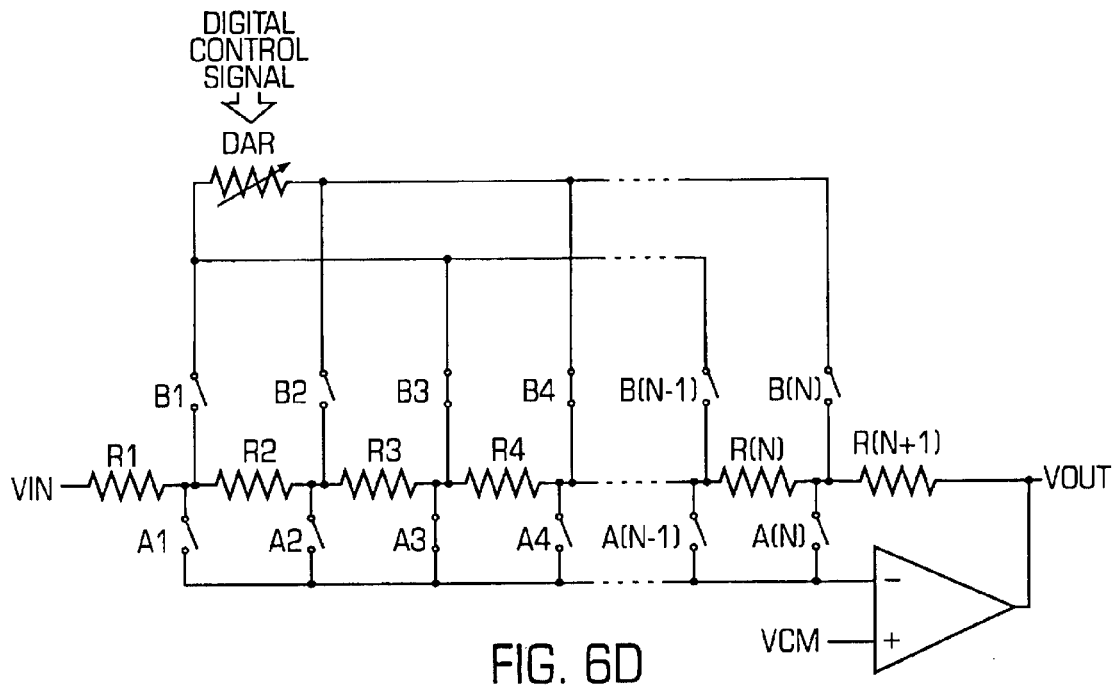

(5) Transition switch B2 is opened and transition switch B4 is closed (FIG. 6D).

(6) The DAR transitions to a desired low resistance.

Figure 6E:
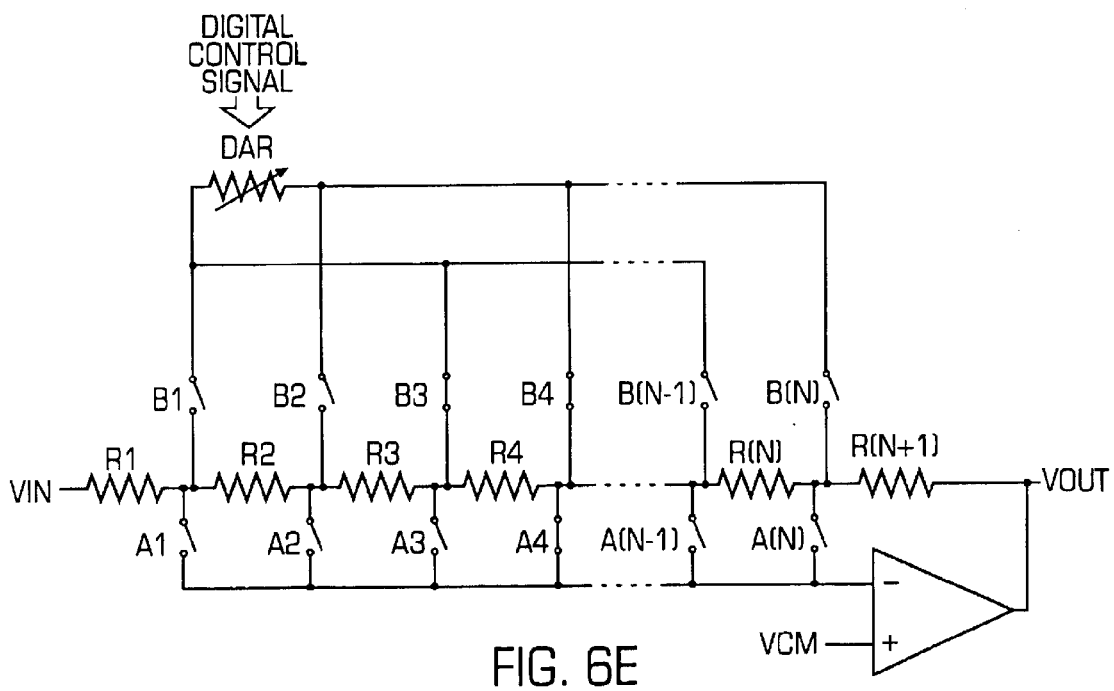

(7) Setting switch A3 is opened and setting switch A4 is closed (FIG. 6E).

(8) The DAR transitions to a desired high resistance.

Figure 6F:
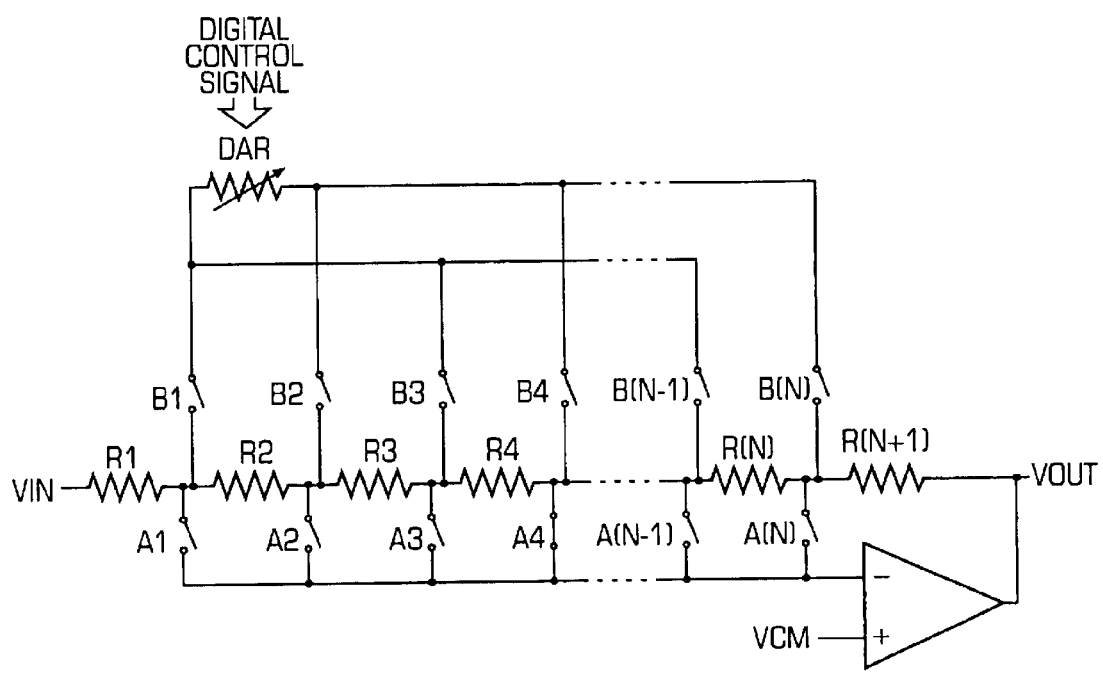

(9) Transition switch B3 and transition switch B4 are opened (FIG. 6F).

At this point, the volume control is set to the fourth main setting, with setting switch A4 closed and all other switches (setting and transition) open (FIG. 6F).

The DAR allows the transitions between intermediate settings to be very gradual and digitally controlled. The change between settings can be of any desired size. In addition, not all the settings need to be used at all times which allows variable transitions. For example in one embodiment a DAR might have sixteen settings (possible resistances). In a "fast transition" the digital control signals cause the DAR to increment four settings at a time (a total of four steps) while in a "slow transition" the digital control signals cause the DAR to increment one setting at a time (a total of sixteen steps). More likely, however, the DAR has a larger number of settings, e.g., $2^8$ or $2^{32}$ settings depending upon the embodiment. Alternately the duration of time between increments might vary (e.g., longer times for the first steps, shorter times for later steps). In another variation the duration of time between increments might vary within a series of increments from one main setting to the next (e.g., slow at first, then quick at the end, or quick-slow-quick). Different combinations may be found desirable depending on performance characteristics of other equipment (e.g., power supply, speakers, etc.). Because the DAR operates in response to digital control signals, the same volume control device can be used in various applications which have different digital controllers (external to the volume control device).

A number of embodiments of the present invention have been described. Nevertheless, it will be understood that various modifications may be made without departing from the spirit and scope of the invention. Accordingly, it is to be understood that the invention is not limited by the specific illustrated embodiments, but only by the scope of the following claims.

What is claimed is:

1. A volume control device comprising:

a plurality of resistors, connected to one another in series, and a plurality of switches arranged to change connections between said resistors, to thereby change an overall gain of said plurality of resistors;

a digitally adjustable resistor, selectively connectable across at least a plurality of different ones of said resistors, and variable between a high resistance which when connected across any of said ones of said resistors does not significantly change its resistance, and a low resistance which when connected across any of said ones of said resistors effectively eliminates its resistance;

an operational amplifier, where the output of the operational amplifier is connected to a node which is between the resistor which is last in the plurality of resistors connected in series and an output of the volume control device;

a plurality of setting switches, where each setting switch is connected to a corresponding node between two resistors of said plurality of resistors and connected to an input to the operational amplifier; and a plurality of transition switches, where each transition switch is connected to a corresponding node between two resistors of said plurality of resistors and connected to alternating ends of the digitally adjustable resistor.

2. A volume control device comprising:

a plurality of resistors connected in series, coupled to one another, and a plurality of switches arranged to change connections between said resistors to thereby change an overall gain of said plurality of resistors;

a variable resistor, selectively connectable across at least a plurality of different ones of said resistors, and variable between a high resistance which when connected across any of said ones of said resistors does not significantly changes its resistance, and a low resistance which when connected across any of said ones of said resistors effectively eliminates its resistance;

an operational amplifier, where the output of the operational amplifier is connected to a node which is between the resistor which is last in the series of resistors and an output of the volume control device;

a plurality of setting switches, where each setting switch is connected to a corresponding node between two resistors of said plurality of resistors and connected to an input to the operational amplifier; and a plurality of transition switches, where each transition switch is connected to a corresponding node between two resistors of said plurality of resistors and connected to alternating ends of the variable resistor.

3. A volume control device comprising:

a plurality of resistors, coupled to one another, and a plurality of switches arranged to change connections between said resistors to thereby change an overall gain of said plurality of resistors;

a variable resistor, selectively and gradually connectable across at least a plurality of different ones of said resistors, and variable between a high resistance which when connected across any of said ones of said resistors does not significantly change its resistance, and a low resistance which when connected across any of said ones of said resistors effectively eliminates its resistance;

an operational amplifier, where the output of the operational amplifier is connected to a node which is between the resistor which is last in the series of resistors and an output of the volume control device;

a plurality of setting switches, where each setting switch is connected to a corresponding node between two resistors of said plurality of resistors and connected to an input to the operational amplifier; and a plurality of transition switches, where each transition switch is connected to a corresponding node between two resistors of said plurality of resistors and connected to alternating ends of the variable resistor wherein said variable resistor is gradually connectable across said at least a plurality of different ones of said resistors to effect reduction of undesirable noise in the changing of said overall gain.

4. A volume control device comprising:

a plurality of resistors, coupled to one another, and a plurality of switches arranged to change connections between said resistors, to thereby change an overall gain of said plurality of resistors; and a variable resistor, selectively connected across at least a plurality of different ones of said resistors, and variable between a high resistance which when connected across any of said ones of said resistors does not significantly change its resistance, and a low resistance which when connected across any of said ones of said resistors effectively eliminates its resistance;

said volume control device further having each of said resistors of said plurality of resistors connected in series and the variable resistor being a digitally adjustable resistor, and further including:

an operational amplifier, where the output of the operational amplifier is connected to a node which is between the resistor which is last in the plurality of resistors connected in series and an output of the volume control device;

a plurality of setting switches, where each setting switch is connected to a corresponding node between two resistors of said plurality of resistors and connected to an input to the operational amplifier; and a plurality of transition switches, where each transition switch is connected to a corresponding node between two resistors of said plurality of resistors and connected to alternating ends of the digitally adjustable resistor.

5. A volume control device comprising:

a plurality of resistors, coupled to one another, and a plurality of switches arranged to change connections between said resistors, to thereby change an overall gain of said plurality of resistors;

a variable resistor selectively connectable across at least a plurality of different ones of said resistors, and variable between a high resistance which when connected across any of said ones of said resistors does not significantly change its resistance, and a low resistance which when connected across any of said ones of said resistors effectively eliminates its resistance, said variable resistor having N resistance settings, said settings being variable in steps from one of said settings at a time to a plurality of said settings at a time, said resistance settings being varied in sufficiently small steps at a time to reduce undesirable noise as said variable resistor is connected across said at least a plurality of different ones of said resistors; and wherein each of said resistors of said plurality of resistors is connected in series and the variable resistor is a digitally adjustable resistor, further including:

an operational amplifier, where the output of the operational amplifier is connected to a node which is between the resistor which is last in the plurality of resistors connected in series and an output of the volume control device;

a plurality of setting switches, where each setting switch is connected to a corresponding node between two resistors of said plurality of resistors and connected to an input to the operational amplifier; and a plurality of transition switches, where each transition switch is connected to a corresponding node between two resistors of said plurality of resistors and connected to alternating ends of the digitally adjustable resistor.

\* \* \* \* \*